United States Patent [19]

Gordon et al.

[11] Patent Number: 4,801,851
[45] Date of Patent: Jan. 31, 1989

[54] OSCILLOSCOPE MEMORY CONTROL

[75] Inventors: Bernard M. Gordon, Gloucester; Colin Gyles, Boxford, both of Mass.

[73] Assignee: Analogic Corporation, Peabody, Mass.

[21] Appl. No.: 418,190

[22] Filed: Sep. 14, 1982

[51] Int. Cl.⁴ .......................... H01J 29/70; H01J 29/76
[52] U.S. Cl. ..................................... 315/367; 315/403
[58] Field of Search .................. 315/367, 403; 361/89, 361/94; 330/279, 280, 107, 109

[56] References Cited

U.S. PATENT DOCUMENTS 4,169,996 10/1979 Cavigelli ............................. 315/388
4,214,590 7/1980 Patnoi et al. ....................... 128/710
4,251,754 2/1981 Navarro et al. ..................... 315/367

Primary Examiner—Theodore M. Blum
Assistant Examiner—Gregory C. Issing
Attorney, Agent, or Firm—David W. Gomes

[57] ABSTRACT

A memory control for use with a digital oscilloscope having a display and a digital memory storing a sequence of signal samples. The sequence of signal samples is cyclically read from memory and displayed. The memory control adjusts the memory access operation to provide a controlled signal flow to the display at a rate within the slew-rate limits of the graphic display. In the memory control, the point slew, or distance over which the display beam moves from the present data point to the next point, is measured. If the point slew relative to the time interval between displayed signal samples exceeds the slew-rate capability of the display, the signal flow from the memory for subsequent data points is reduced or inhibited for a time sufficient to allow the display to reach a coordinate position corresponding to the desired data point.

10 Claims, 1 Drawing Sheet

OSCILLOSCOPE MEMORY CONTROL

FIELD OF THE INVENTION

The present invention relates to graphic systems displaying prestored data signals, and more particularly, to digital oscilloscopes having a display and digital memory wherein the display has a slew-rate limit.

BACKGROUND OF THE INVENTION

Oscilloscopes and computer systems incorporating display devices have, for many years, produced signals which are within the display capability of the associated display device. For instance, analog oscilloscopes have produced visual displays on cathode ray tubes (CRT) in a real-time condition wherein input signals are displayed as they occur. Generally, the technology of display tubes and systems has always been sufficiently advanced to always permit the signal to be displayed with a minimum of distortion, and in particular, with a minimum of distortion caused by slew-rate limiting. Slew-rate limiting is a distortion caused by the limiting (maximum) rate over which a particular spot or point may be moved over the surface of the CRT, or in the case of X-Y plotters, the display area. This limitation typically has a value in terms of coordinate distance per unit time, such as ten inches per microsecond. As the technology has advanced, the signals to be displayed have begun to exceed the ability of the visual display unit to accommodate the signal excursion without limitation from the inherent display slew-rate limit. Alternately, the expense of a display having sufficiently high slew-rate capability becomes a significant element of the total system cost. Typical examples of this situation are found in high-speed analog oscilloscopes and computer graphics displays.

Previously, to avoid the problem of slew-rate limitation in systems having a signal displayed in one coordinate axis accordign to a display of time in an orthogonal axis, such as a typical oscilloscope display, the rate of increase of the time axis signal is reduced. However, this causes display image flicker (flicker being caused by the CRT image brightness decaying before a retrace occurs), or an restrictive limit on the information which may be displayed without flicker.

BRIEF DESCRIPTION OF THE INVENTION

The present invention incorporates control circuits for displaying a sequence of stored signal samples on a multi-coordinate display which has an inherent slew-rate limit in at least one of the coordinates. A typical display comprises a magnetic deflection CRT system with a vertical axis slew-rate limit of 0.12 inches per microsecond. A coordinate signal generator provides the appropriate horizontal and vertical coordinate signals to the display, the coordinate signals being created in response to the stored or calculated digital signal samples. A coordinate signal delay is incorporated to inhibit the coordinate generator from producing subsequent coordinate signals when it is anticipated that the display slew-rate will be exceeded by the signal excursion produced by the generated coordinate signals. In particular, the coordinate generator provides display signals to a CRT where the horizontal coordinate corresponds to a time interval in which the viewer assumes that distance along horizontal axis corresponds to elapsed time. The system according to the present invention maintains the horizontal coordinate value proportional to the desired time scale position and varies the actual coordinate signal generation rate to permit the actual writing speed of the CRT to be within the CRT slew-rate limits.

In particular, the horizontal display rate is maintained at a maximum velocity for small vertical signal excursions and reduced and/or stopped according to a delay signal when a vertical signal excursion is anticipated to exceed the vertical axis slew-rate limit of the CRT display. The vertical axis signal is provided by a digital-to-analog converter from a digital word which is stored in or calculated by the coordinate signal generator; the horizontal signal is formed by an integrator receiving a pulse sequence controlled by the display delay signal stored in or calculated by the coordinate signal generator. The system according to the present invention may be included, in part, within a digital processor, wherein the signals to be displayed are stored as signal representations within the digital processor memory. The horizontal coordinate delay signal according to the present invention is predetermined and stored in a memory position corresponding to the respective vertical axis signal representation.

BRIEF DESCRIPTION OF THE DRAWING

These and other features of the present invention can be better understood when read with the following specification taken together with the drawing wherein.

DETAILED DESCRIPTION OF THE INVENTION

Figure 1:
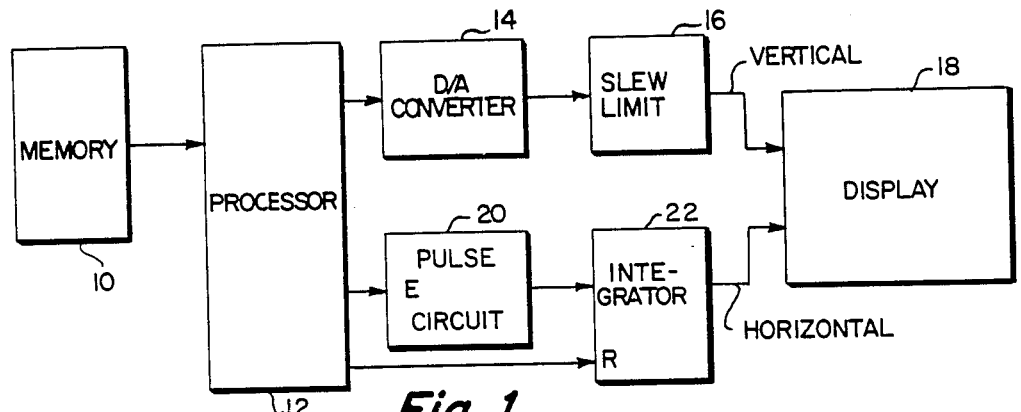
FIG. 1 is a block diagram of one embodiment of the present invention.

The system according to the present invention is applicable to any system having digital information to be displayed on a display or graphics device having a finite slew-rate limit. A typical block diagram is shown in FIG. 1 wherein a processor 12 having memory 10, provides a plurality of signals wherein an image is generated on the display 18. In particular, the horizontal axis input signal is generated by a controllable integrator 22 which receives a sequence of finite length pulses from pulse circuit 20 having an adjustable period between each pulse. The pulse circuit 20 is enabled by the processor to initiate the finite length pulse, which in turn is received by the integrator 22. The integrator 22 accumulates the pulse signals to provide a sweep signal to the display 18 horizontal coordinate input. A retrace signal is provided by the processor to reset the integrator output signal level, causing the display to revert to an original starting position.

The processor 12 also provides a digital signal to a digital-to-analog converter 14, which provides analog output signals. Thereafter, a slew limiter 16 transforms the step-like converter 14 output into a uniformly varying voltage which in turn is received by one axis input of the display 18. The slew-limit circuit 16 is optional as the slew limit of the display 18 itself may be used to convert the step-wise analog output of converter 14 into a uniformly varying signal; however, when used in this mode, the display will often exhibit a character or spot overshoot due to the inability of the display to stop the motion of the spot when the signal from the converter 14 itself stops changing.

According to the present invention, the sequence of pulses is determined by the processor 12 in conjunction with the signal stored in memory 10, wherein each location in memory having a signal representative of the vertical position (and thus received by the digital-to-analog converter 14) has a corresponding memory space having a pulse interval value or delay signal. The larger the pulse interval value, the greater the time intervals between the pulse enable signal received by the pulse circuit 20.

Practical integrators cannot be started or stopped instantaneously. With each start or stop of the integrator, there is a corresponding delay in the integrator response. If the start and stop delays are not identical, as is typically the case with manufactured products using components of available tolerances, a time offset error will be generated; moreover, the time offset errors are cumulative. The visual result is that a signal representation traversing a large portion of the vertical (slew-rate limited) coordinate will take longer to traverse a horizontal coordinate (in time) by comparison to the same signal displayed over a lesser portion of the vertical coordinate (having fewer slew-rate limited vertrical signals). Therefore, according to the present invention, every signal representation is uniformly displayed with the same number of starts and stops, and the time interval between the starts and stops lengthened, when necessary. In particular, the horizontal display is started and stopped for each vertical signal sample (typically 512 times per horizontal sweep), the delay signal causing the time between respective stop and start signals to be increased accordingly.

In the embodiment shown, the integrator is a linear integrator; therefore, the additional (delay) time needed between the pulses produced by circuit 20 is directly calculated according to a predetermined slew-rate limit known and used to calculate the delay value. The corresponding delay in vertical signal then causes the D/A 14 output signal (typically volts) relative to the interval between pulse circuit 20 output (in time) to be less than the known display 18 slew-rate limit. Typically, the difference between two successive vertical (analog) signals having their representative digital signal stored in memory 10 is computed within the processor 12 before being received and converted by D/A converter 14. If the resulting difference causes the proportion to exceed the display slew-rate limit of the display 18, the first of the vertical digital signal representations stored in memory 14 is assigned a corresponding delay time between the pulses produced by circuit 20, thus allowing the vertical signal received by the display 18 to arrive at its corresponding screen position before the subsequent digital vertical signal from memory is received by converter 14 and sent to display 18. The delay times corresponding to the vertical (digital) signals may be computed before the signal is displayed, or they may be continuously computed as digital signals are provided through the processor 12.

Figure 2:
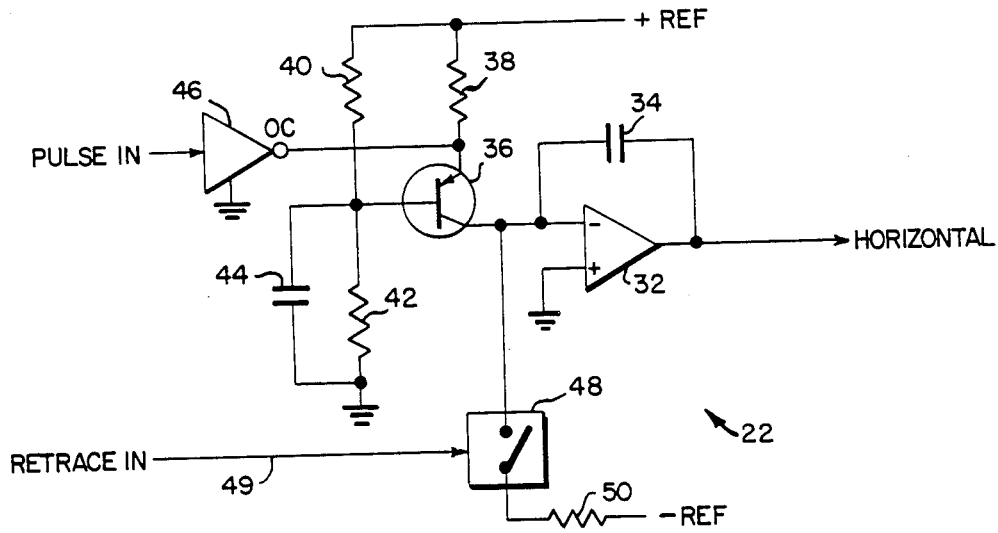
FIG. 2 is a schematic diagram of the integrator of FIG. 1.

The integrator 22 shown in FIG. 2 includes amplifier 32 and capacitor 34 and receives a current from a switchable current source including transistor 36. The current is determined according to the emitter resistor 38 and the base voltage divider comprising resistors 40 and 42. The current sources is disabled or turned-off by an open collector logic gate 46 which pulls the transistor 36 emitter to or near a ground (zero volt) potential to cause transistor 36 to become cut-off when a positive level control signal is received by gate 46. The integrator 22 is reset (for display retrace) by providing a reverse polarity signal through resistor 50 via controllable switch 48 which receives a signal from processor 12 along lead 49. The voltage to which resistor 50 is connected as well as the value of resistor 50 and the duration for which the switch 48 is closed is selected according to desired retrace parameters. Moreover, the specific selection of component values for the resistors and capacitors used in the integrator circuit 22 are within the skill of those in the art, and may be selected to produce the desired operating characteristics from the circuitry shown in FIG. 2.

Figure 3:
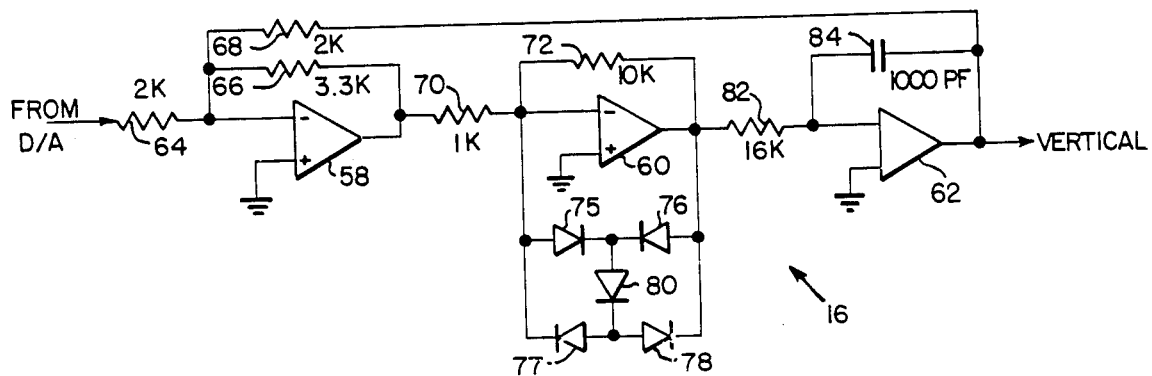
FIG. 3 is a schematic diagram of the slew limiter of FIG. 1.

A slew limiter 16 of FIG. 1 is shown in detail in FIG. 3. The slew limiter 16 includes amplifiers 58, 60 and 62 forming a controlled gain amplifier, voltage limiter and integrator circuit, respectively. In this embodiment, the overall slew limiter gain is −1 or unity and is determined by the ratio of resistors 68 and 64. The amplifier 58 and feedback resistor 66 is included to provide the stable operation of the slew-rate limiter. The voltage limiter portion including amplifier 60 includes resistors 70 and 72 with additional feedback components including diodes 75, 76, 77, 78 and 80. The amplifier 60 output varies linearly with the output of amplifier 58 until a voltage across the combination of diodes included in the feedback network begins to conduct, whereupon the amplifier 60 output remains essentially constant. The limited voltage output from the amplifier 60 is received by the integrator amplifier 62 through input resistor 82, which provides an accumulated signal in the integrator feedback capacitor 84. Since the amplifier 60 output is limited in voltage, the integrator, including amplifier 62, will be limited in rate of change. A feedback signal is received by the amplifier 58 through resistor 68 to establish the overall slew limiter gain. The stability of the circuit is improved by feedback resistor 66. According to the circuit shown in FIG. 3, a stepwise analog input from the digital-to-analog converter 14 will be received by the slew limiter 16 which in turn provides a signal having a maximum rate of change of 0.125 volts/microsecond according to the values chosen therein, preferably being less than the slew-rate limit of the display 18.

Alternate embodiments including a variety of processors and memories, as well as component values of the circuits shown, are within the scope of the invention, which is not to be limited except by the following claims.

What is claimed is:

1. Apparatus for displaying signals corresponding to a stored sequence of signal samples comprising:
   multi-coordinate display means having a slew-rate limit value in at least one coordinate;
   coordinate signal generating means responsive to said stored signal samples providing at least two coordinate signals; and
   coordinate delay means for providing a delayed coordinate signal to the other coordinate of said display means to prevent respective coordinate signals from exceeding said display slew-rate limit of said one display means coordinate, including
   an integrator for providing said other of said coordinate signals having a constant number of start and stop operations for each display trace.

2. The apparatus of claim 1 wherein said delay means is operative according to a delay signal corresponding to said stored sequence of signal samples provided by said coordinate generating means.

3. The apparatus of claim 2 wherein said coordinate signal generating means includes a pulse generator providing a sequence of pulses received by said integrator, wherein said pulse generator is controlled according to said delay signal to inhibit in said sequence of pulses causing a delay in said sweep signal.

4. The apparatus of claim 3 further including a digital processor storing said signal samples and said delay signal.

5. The apparatus of claim 4 wherein said coordinate signal generating means includes a converter receiving a sequence of digital signals from said digital processor corresponding to said signal samples, and producing an analog signal to be received by said display means.

6. The apparatus of claim 5 wherein said coordinate signal generating means includes a slew-rate limiter to impose upon said converter output a slew rate less than the respective said display slew-rate limit.

7. The apparatus of claim 3 wherein:
said sweep signal is repetitive according to a predetermined interval; and
said signal samples comprise periodically sampled data signals, wherein said sweep signal interval corresponds to the period of a plurality of said sampled data signals.

8. The apparatus of claim 1, further including
voltage limiter means for receiving said one of said coordinate signals corresponding to the slew-rate limited coordinate of said display, and providing a limiter output signal having a predetermined maximum amplitude; and
integrator means for integrating said limiter output signal to provide a coordinate signal to said multi-coordinate display and having maximum signal slew-rate at or below the maximum multi-coordinate display slew-rate limit.

9. A method of displaying a two-dimensional signal on a display with a maximum slew rate in at least the second of said two dimensions, comprising the steps of:
repeatedly providing an integrated first dimension signal with a uniform number of start and stop periods of signal change therein;
determining if the second dimension signal exceeds the second dimension maximum slew rate; and
conditionally providing additional stop period time of said integrated first dimension signal when the corresponding second dimension signal exceeds said second dimension maximum slew rate of said display.

10. The method of claim 9, further including the step of
limiting the second dimension signal to be equal or less than the second dimension maximum slew rate of said display.

* * * * *